(12) United States Patent
Byeon et al.

(10) Patent No.: US 6,590,442 B2
(45) Date of Patent: Jul. 8, 2003

(54) VOLTAGE BOOSTING CIRCUIT FOR AN INTEGRATED CIRCUIT DEVICE

(75) Inventors: Dae-Seok Byeon, Seoul (KR); Young-Ho Lim, Kyunggi-do (KR)

(73) Assignee: Samsung Electronics, Co. Ltd., Suwon (KR)

( * ) Notice: Subject to any disclaimer, the term of this patent is extended or adjusted under 35 U.S.C. 154(b) by 0 days.

(21) Appl. No.: 09/877,811

(22) Filed: Oct. 11, 2001

(65) Prior Publication Data

US 2002/0130702 A1 Sep. 19, 2002

(30) Foreign Application Priority Data

Nov. 23, 2000 (KR) .......................... 2000-69982

(51) Int. Cl.[7] .............................. G05F 3/24
(52) U.S. Cl. ...................... 327/537; 327/535
(58) Field of Search ................. 327/310, 313, 327/327, 535, 536, 537; 363/59, 60

(56) References Cited

U.S. PATENT DOCUMENTS

| | | | | |
|---|---|---|---|---|
| 5,180,928 A | * | 1/1993 | Choi .......................... | 363/60 |
| 5,530,640 A | * | 6/1996 | Hara et al. .................. | 327/534 |
| 5,898,335 A | * | 4/1999 | Miyamoto et al. .......... | 327/535 |
| 6,091,282 A | * | 7/2000 | Kim ........................... | 327/536 |

OTHER PUBLICATIONS

Chen, et al., "A 2.7V only 8Mbx16 NOR Flash Memory", IEEE 1996 Symposium On VLSI Circuits Digest of Technical Papers, pp. 172–173.
"Quick Double Bootstrapping Scheme for Word Line of 1.8V Only 16Mb Flash Memory", The 6th Korean Conference for Semiconductor, Feb. 1999, IEEE Korea Council Electron Device Chapter, Cover Page, pp. 391–392.

* cited by examiner

Primary Examiner—Timothy P. Callahan
Assistant Examiner—Terry L. Englund
(74) Attorney, Agent, or Firm—Marger Johnson & McCollom, P.C.

(57) ABSTRACT

A voltage boosting circuit for an integrated circuit includes a booster and a voltage clamp circuit. The booster generates a boosted voltage higher than the supply voltage in response to a boosting control signal. The voltage clamp circuit includes a voltage detector, a pulse generator, and a discharge circuit. The voltage detector generates, in response to the boosting control signal, a detected voltage signal representing an attribute of the boosted voltage. The pulse generator generates a pulse signal responsive to the detected voltage signal. And the discharge circuit discharges the boosted voltage during an activation period of the pulse signal. This largely stabilizes the output voltage of the booster.

15 Claims, 5 Drawing Sheets

VOLTAGE BOOSTING CIRCUIT FOR AN INTEGRATED CIRCUIT DEVICE

This application claims the priority benefit of Korean Patent Application No. 2000-69982, filed on Nov. 23, 2000, the contents of which are herein incorporated by reference in their entirety.

FIELD OF THE INVENTION

The present invention relates to the field of an integrated circuit device, and more particularly to a voltage boosting circuit for an integrated circuit device.

BACKGROUND OF THE INVENTION

Nonvolatile semiconductor memory devices for integrated circuit devices are expected to experience a sharp increase in market demand. That is because such devices (and especially flash memory devices) will be used in portable devices such as cellular phones and personal digital assistants (PDAs).

Portable devices are limited by their batteries. To reduce power consumption, portable devices strive to operate on lower power supply voltages. This extends their usage time from a single battery, and results in these devices becoming lighter.

While the available power supply voltages are becoming lower, the integrated circuit devices compensate for this by generating higher voltages internally. This is accomplished by boosting circuits, which use a boosting mechanism to generate a high voltage (hereinafter refer to as boosted voltage).

One of the challenges is to maintain the boosted voltage uniform, even though the level of the external power supply voltage changes. If the boosted voltage is instead permitted to fluctuate, the applied voltage to MOS transistors also fluctuates. This causes serious problems in operating the integrated circuit device. For example, there may be a malfunction by applying an excessive high voltage. That is because a voltage higher than a breakdown voltage is applied to a p-n junction in the integrated circuit device. Further, there may also be a destruction of an insulation film in the MOS transistors, which would suddenly increase power consumption.

Referring now to FIG. 1, a method has been developed to reduce the fluctuation of a boosted voltage, when a power supply voltage is varied. The method is proposed in the paper titled "A 2.7V Only 8 Mb'16 NOR Flash Memory" (IEEE 1996 Symposium On VLSI Circuits Digest of Technical Papers, pp. 172–173). The voltage boosting circuit of the proposed paper is reproduced in FIG. 1.

Referring to FIG. 1, the essence of the method is to control the number of capacitors used in the boosting mechanism. A conventional voltage boosting circuit is constructed of a booster 10 and a control logic 12. The booster 10 includes two inverters 20 and 24, two capacitors 22 and 26, and a PMOS transistor 28, connected as shown in FIG. 1.

The booster 10 generates a boosted voltage VPP higher than a power supply voltage VCC, in response to a low-to-high transition of a control signal. According to a control signal Vcdet, the control logic 12 determines the number of capacitors to be used in the booster 10 by an alternative selection of inverters 20 and 24 in the booster 10. A voltage level of the control signal Vcdet can be determined by a voltage divider (not shown), for dividing the boosted voltage VPP.

If the voltage level of the control signal Vcdet rises in accordance with an increase of the boosted voltage VPP, the control logic 12 disables one of inverters 20 and 24 used in the booster 10. Namely, the booster 10 operates by using one capacitor, and therefore the VPP is decreased by about a half. If the VPP becomes low, the control logic 12 enables a disabled inverter. The booster 10 then operates by using the two capacitors 22, 26, and therefore the VPP becomes high again.

FIG. 2 is a graph showing a relation of fluctuation of the power supply voltage and variation of boosted voltage in a conventional voltage boosting circuit. If the power supply voltage is positioned between VCC1 and VCC2, the control logic 12 is designed to use both capacitors 22 and 26 of the booster 10. In this case, the boosted voltage VPP from the booster 10 is positioned between VPP1 and VPP2 by a boosting operation using a couple of capacitors. If the power supply voltage is leveled between VCC2 and VCC3, the control logic 12 is designed to use one of capacitors 22 and 26 of the booster 10. In this case, the boosted voltage VPP is positioned between VPP2 and VPP1 by a boosting operation using one capacitor.

FIG. 2 is a graph VPP(10), which shows a boosted voltage VPP having wide variations depending on variations in the power supply voltage VCC. It means that an integrated circuit device (which receives VPP as its power supply) has an unstable operation.

Therefore, to ensure a stable operation, there exists a need for a voltage boosting circuit that fluctuates very little due to variations in the power supply voltage.

SUMMARY OF THE INVENTION

The object of the present invention is to provide a voltage boosting circuit for an integrated circuit which outputs a boosted voltage with reduced fluctuations as a result of variations in the power supply voltage.

According to an aspect of the present invention, the voltage boosting circuit for an integrated circuit includes a booster and a voltage clamp circuit. The booster generates a boosted voltage higher than the supply voltage in response to a boosting control signal. The voltage clamp circuit includes a voltage detector, a pulse generator, and a discharge circuit. The voltage detector generates, in response to the boosting control signal, a detected voltage signal representing an attribute of the boosted voltage. The pulse generator generates a pulse signal responsive to the detected voltage signal. And the discharge circuit discharges the boosted voltage during an activation period of the pulse signal. This largely stabilizes the output voltage of the booster.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENT

Referring now to FIGS. 3–6, a preferred embodiment of the present invention is described.

Figure 3:
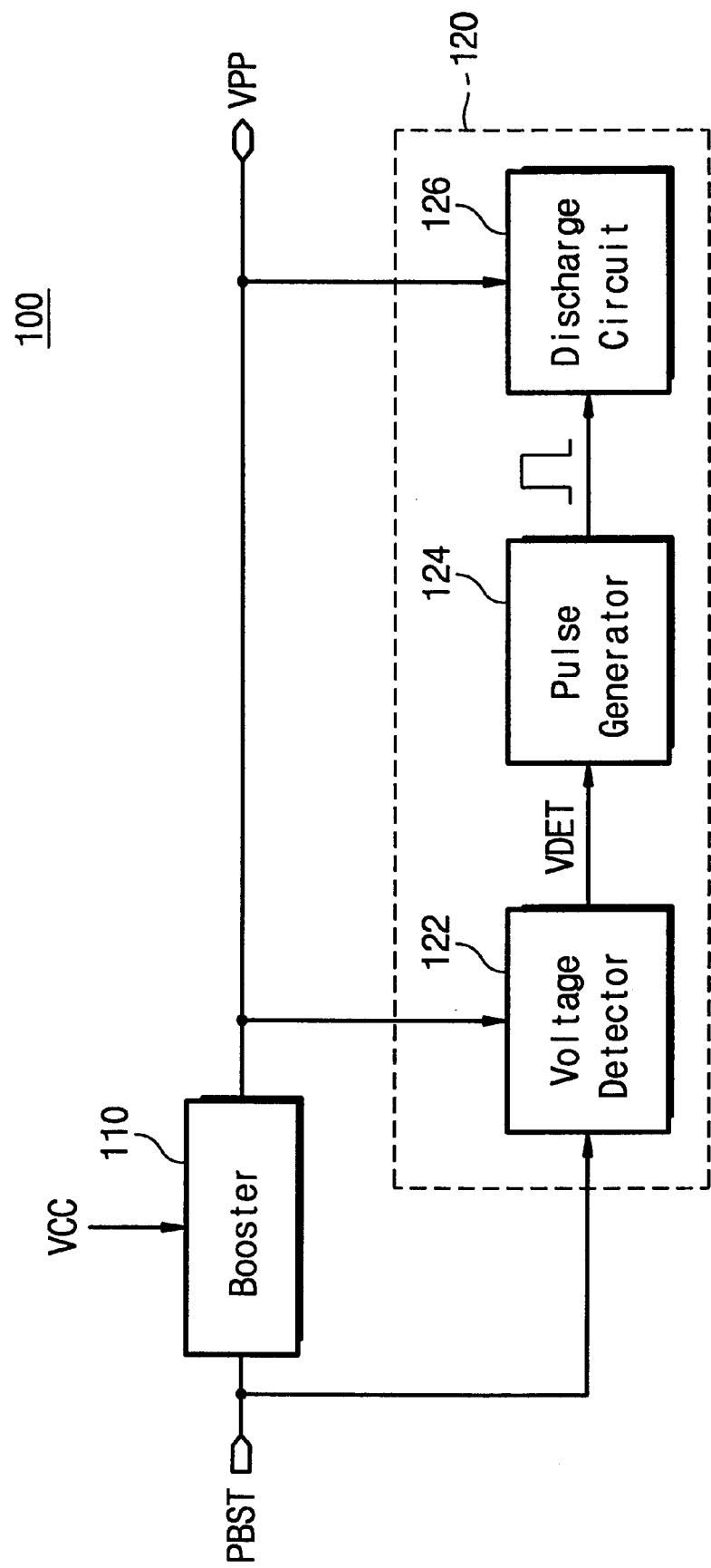
FIG. 3 is a block diagram of a voltage boosting circuit for an integrated circuit according to an embodiment of the present invention.

FIG. 3 is a block diagram showing a voltage boosting circuit of an integrated circuit device in accordance with the present invention. A voltage boosting circuit 100 includes booster 110 and voltage clamp circuit 120, which is also known as voltage stabilizer.

The booster 110 operates in response to a boosting control signal PBST. It generates a boosted voltage VPP, which is higher than the external power supply voltage VCC, which is also called first supply voltage. The power supply voltage VCC is typically the one provided by the battery in a portable device. The booster 110 operates by using the first supply voltage VCC, and a second supply voltage lower than the VCC. The second supply voltage can be the ground voltage GND.

The voltage clamp circuit 120 is connected to the VPP generated from the booster 110. The voltage clamp circuit 120 clamps the VPP to a desired level in response to the boosting control signal PBST.

The voltage clamp circuit 120 is constructed of a voltage detector 122, a pulse generator 124, and a discharge circuit 126.

The voltage detector 122 is connected so as to receive the boosted voltage VPP. When the boosted voltage VPP is over a first predetermined threshold voltage, the voltage detector 122 generates a detected voltage signal VDET. Signal VDET has a voltage level representing an attribute of the boosted voltage. In the preferred embodiment, the attribute is a deviation of the instantaneous boosted voltage VPP from a desired preset voltage VPPd. Accordingly, the signal may have a magnitude proportional to that deviation.

The pulse generator 124 generates a pulse signal PL, which is high ("activated") while the voltage level of the VDET is higher than the predetermined threshold voltage. Pulse signal PL is input in the discharge circuit 126.

The discharge circuit 126 discharges to decrease gradually the VPP while the pulse signal from the pulse generator 124 is activated.

While the boosted voltage VPP is being gradually decreased, the detected voltage signal VDET is also being decreased commensurately. When the gradually decreasing boosted voltage VPP attains the desired level, the detected voltage signal VDET becomes such that the pulse signal PL is no longer generated. Thus, the discharge circuit 126 is disabled, and it stops discharging of the VPP. Thus the boosted voltage VPP becomes stable at the desired level.

Figure 4:
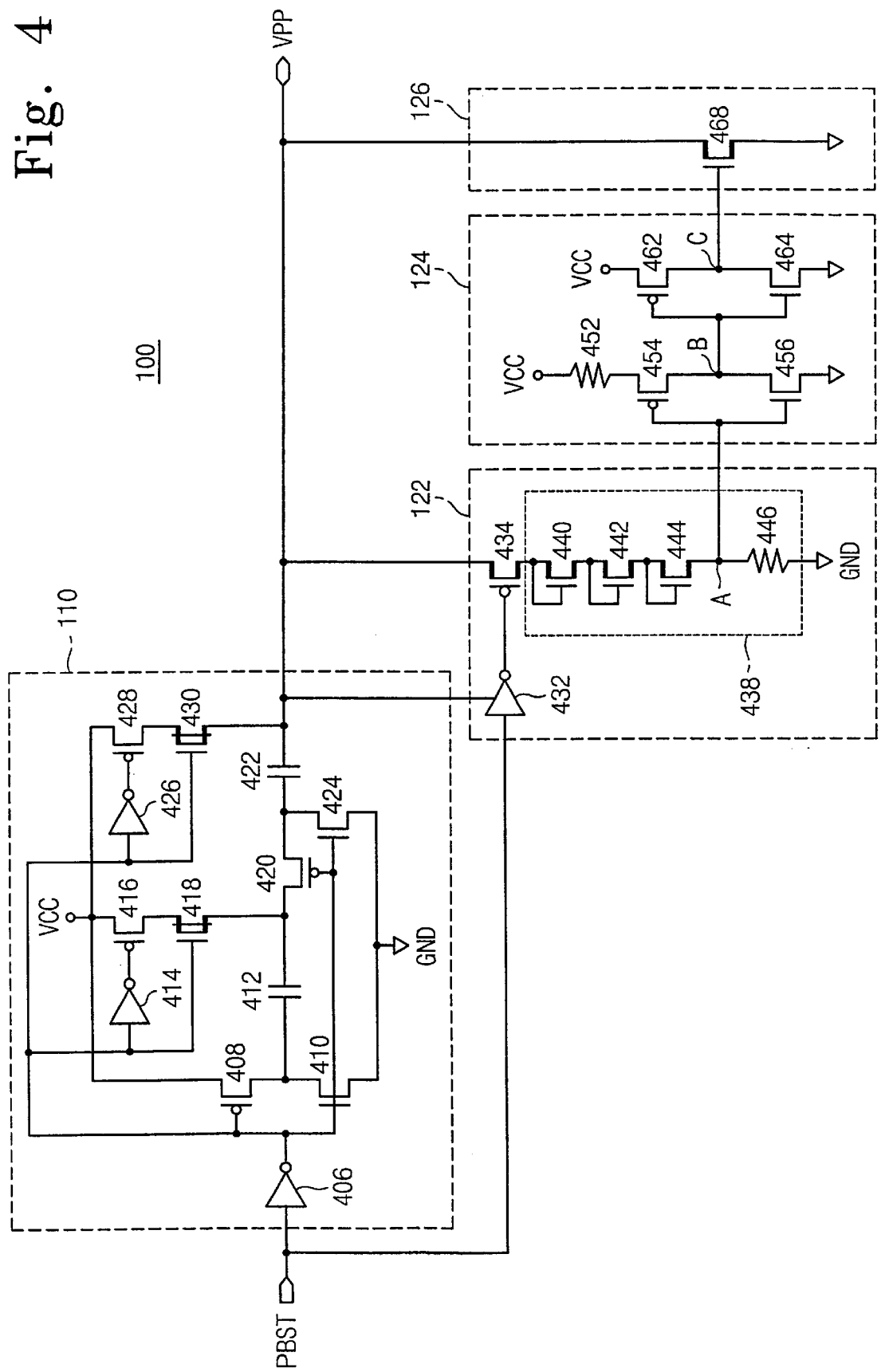
FIG. 4 is a circuit diagram showing the preferred embodiment of the voltage boosting circuit of FIG. 3.

FIG. 4 shows a preferred embodiment of the voltage boosting circuit 100 according to the present invention. The components 110, 122, 124, 126 are identifiable from FIG. 3.

The booster 110 is proposed by "Quick Double Bootstrapping Scheme for Word Line of 1.8V Only 16 Mb Flash Memory" (The 6th Korean conference for Semiconductor, February 1999). It includes inverters 406, 414, and 426; PMOS transistors 408, 416, 420, and 428; NMOS transistors 410 and 424; depletion-type MOS transistors 418 and 430; and capacitors 412 and 422. The transistors 418 and 430 are designed to withstand high voltage.

The voltage detector 122 includes an inverter 432, a PMOS transistor 434, and voltage divider 438. The inverter 432 is supplied with the VPP as an operating voltage, and receives the boosting control signal PBST.

The PMOS transistor 434 has a source connected for receiving the boosted voltage VPP and a drain connected to the voltage divider 438. It also has a gate connected to the inverter 432, for being turned on or off by the boosting control signal PBST.

The voltage divider 438 is composed of three NMOS transistors 440, 442, and 444, and a resistor 446. The transistors 434, 440, 442, and 444 are designed to be adapted to high voltage, and are connected so as to operate the NMOS transistors as diodes. Their current paths are connected between the drain of the PMOS transistor 434 and a node A.

When the boosting control signal PBST goes from a low level to a high level, the PMOS transistor 434 is turned on. As a result, the boosted voltage VPP is applied to the voltage detector 122 through the PMOS transistor 434. If the VPP is lower than a voltage corresponding to sum of threshold voltages of the diode-connected NMOS transistors 440, 442, and 444, then a current path through them is not turned on. On the other hand, if the VPP is higher than a voltage corresponding to sum of threshold voltages of the diode-connected NMOS transistors, the current path of the diode-connected NMOS transistors is turned on. In that case, a voltage at node A is a function of the VPP, by operation of the resistor 446. Namely, the VPP is divided by the voltage divider 438, and thereby the divided voltage VDET is provided as a detected value of VPP level to the pulse generator 124.

The pulse generator 124 includes at least one inverter. In the embodiment of FIG. 4, it includes a first inverter and a second inverter. These are formed as follows.

The pulse generator 124 includes a resistor 452, two PMOS transistors 454 and 462, and two NMOS transistor 456 and 464. The resistor 452 and transistors 454 and 456 compose the first inverter circuit, having an output terminal B. A current path of the resistor 452, the PMOS transistor 454, and the NMOS transistor 456 is connected between the power supply voltage VCC and the ground voltage GND in series. Both transistors 454 and 456 are controlled by the detected voltage signal VDET.

The transistors 462 and 464 compose the second inverter circuit, having an output terminal C. A current path of the PMOS transistor 462 and the NMOS transistor 464 is connected between the VCC and the GND in series, and gates of the transistors 462 and 464 is commonly connected to output terminal B of the first inverter circuit.

In the first inverter circuit, a logical threshold voltage (or triggering voltage) of the inverter circuit is accomplished by providing the VCC through the resistor 452. As a conductivity of a pull-up transistor (PMOS transistor), which connects the output terminal B with the power supply voltage VCC becomes low, the logical threshold voltage of the first inverter circuit becomes lower than before. On the other hand, as a conductivity of a pull-down transistor (NMOS transistor), which connects the output terminal B with the ground voltage GND becomes low, the logical threshold voltage of the inverter circuit becomes higher. If the resistor 452 is inserted at the pull-up terminal side, the logical threshold voltage of the inverter circuit becomes low, and thereby reduces fluctuation of the logical threshold voltage affected by variation of the VCC. More particularly, fluctuation of desired boosted voltage becomes reduced. Inserting a resistor at the pull-down terminal side can raise the logical threshold voltage of the inverter circuit.

The second inverter circuit generates a pulse signal PL at node C, by inverting the output signal generated at node B from the first inverter circuit. When the boosted voltage VPP from the booster 110 is completely stable, the node A has a voltage level between that of the power supply voltage VCC and the ground voltage GND. Therefore, the output signal from the terminal B has a voltage level also between a high-leveled VCC and a low-leveled GND. The second inverter circuit prevents a possible instability of the voltage at node B from affecting the output.

The discharge circuit 126 is composed of a NMOS transistor 468 having a current path formed between the VPP and the GND, and a gate connected so as to receive the pulse signal PL generated at node C of the pulse generator 124. The transistor 468 is designed to withstand a high voltage. The discharge circuit 126 is turned on during an activation period of the pulse signal PL, and therefore the boosted voltage VPP is discharged while the discharge circuit 126 is turned on.

Figure 5:
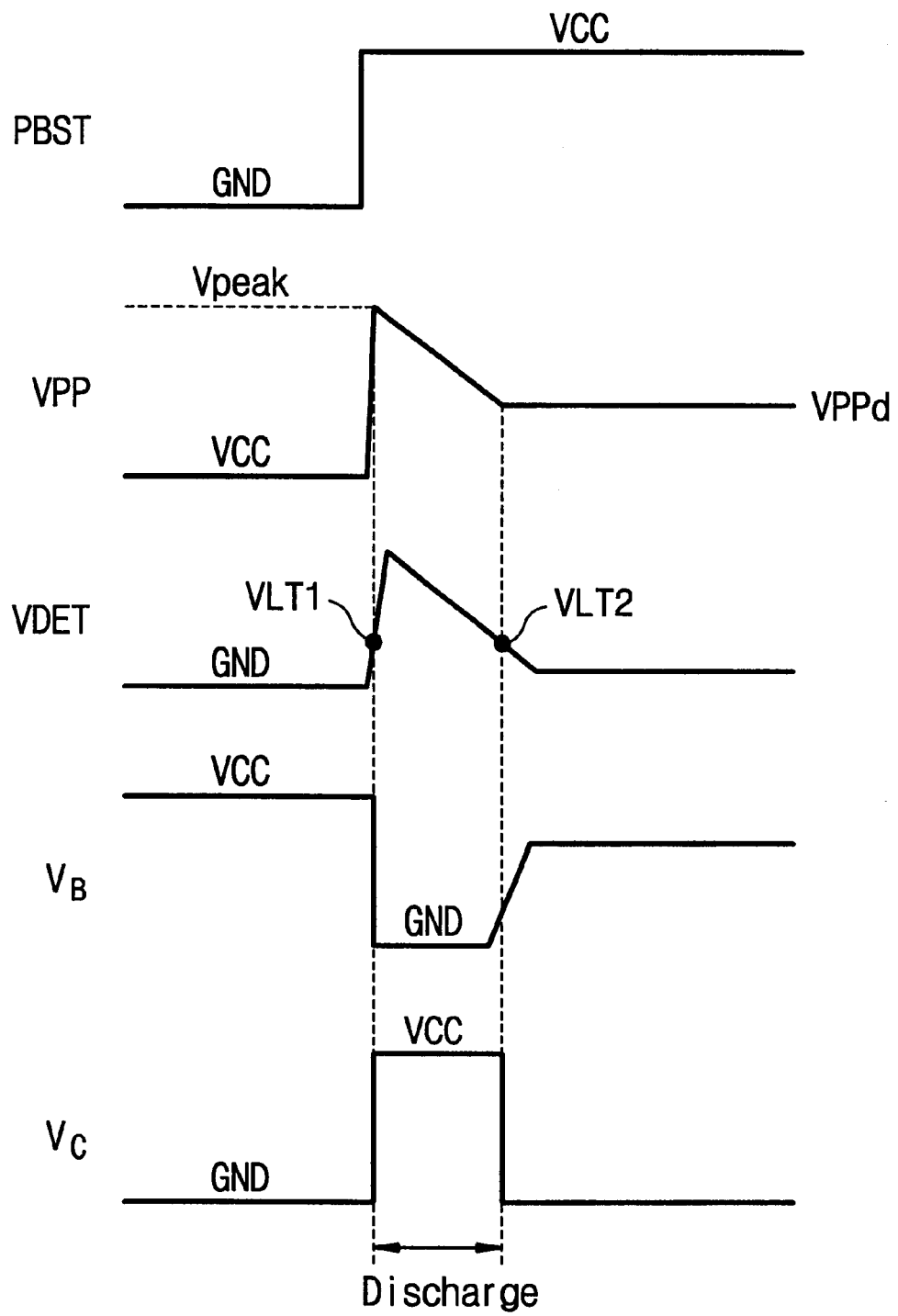
FIG. 5 is a diagram illustrating waveforms of signals and voltages in the voltage boosting circuit of FIG. 4.

FIG. 5 is a diagram illustrating waveforms of signals and voltages in the voltage boosting circuit of FIG. 4. Referring to the FIG. 5, the operation of the voltage boosting circuit will be described below. When the boosting control signal PBST goes from a low level to a high level, the booster 110 generates a boosted voltage VPP voltage, which may have a level Vpeak. Simultaneously, the voltage detector 122 receives the Vpeak from the booster 110 in response to the PBST having a low-to-high transition.

Level Vpeak may be higher than a desired boosted voltage VPPd. If that happens, then by proper design the inputted voltage of the voltage detector 122 is higher than the sum of the threshold voltages of NMOS transistors 440, 442, and 444 in the voltage divider 438. Then the voltage detector 122 generates a detected voltage signal VDET having a voltage level determined by the input voltage VPP. Then, the pulse signal PL goes from a low level to a high level when the detected voltage signal VDET is over a logical threshold voltage VLT1 of the first inverter circuit 452, 454, and 456 corresponding to the low-to-high transition. The NMOS transistor 468 of the discharge circuit 126 is turned on by the pulse signal having a low-to-high transition, and thereby the boosted voltage VPP from the booster 110 becomes gradually low.

When the VPP from the booster 110 is decreased down to the desired boosted voltage level VPPd, it is prevented from being reduced further. This takes place as follows.

As the VPP is approaching the VPPd level, the detected voltage signal VDET at the node A is also being gradually and commensurately decreased. Then, the signal VDET crosses a logical threshold voltage VLT2 of the first inverter circuit 452, 454, and 456 in the pulse generator 124 corresponding to a high-to-low transition. Thus, the voltage at node B starts to increase gradually from the ground voltage GND. After a short while, the pulse signal PL from the node C goes from a high level of the power supply voltage VCC to a low level of the ground voltage GND. This causes the discharge circuit 126 to stop discharging. Thus, the VPP from the booster 110 is maintained to the desired boosting voltage VPPd.

As an additional advantage, the voltage clamp circuit 120 helps the VPP reach equilibrium fast. The maximum voltage Vpeak or an initial voltage of the booster 110 can be reduced to be near the VPPd in less than about 21 nsec.

Figure 2:
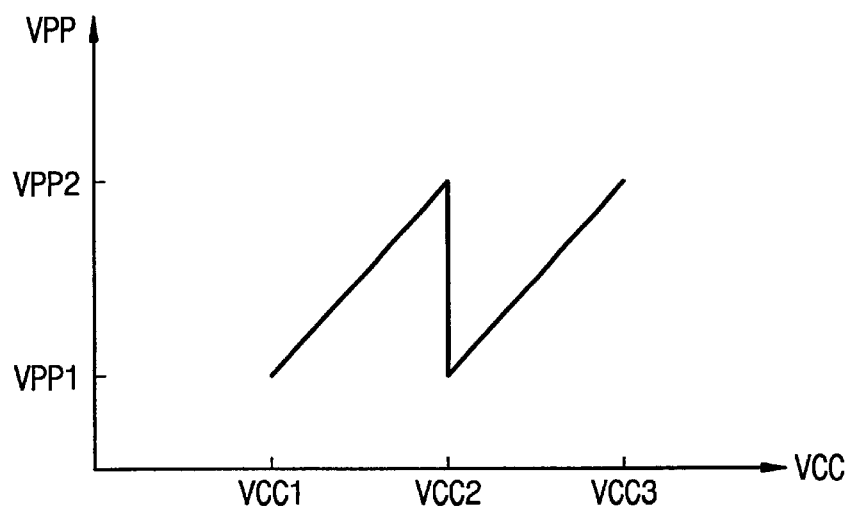
FIG. 2 is a graph showing how the boosted voltage of the circuit of FIG. 1 fluctuates if there is a variation in the power supply voltage.
Figure 6:
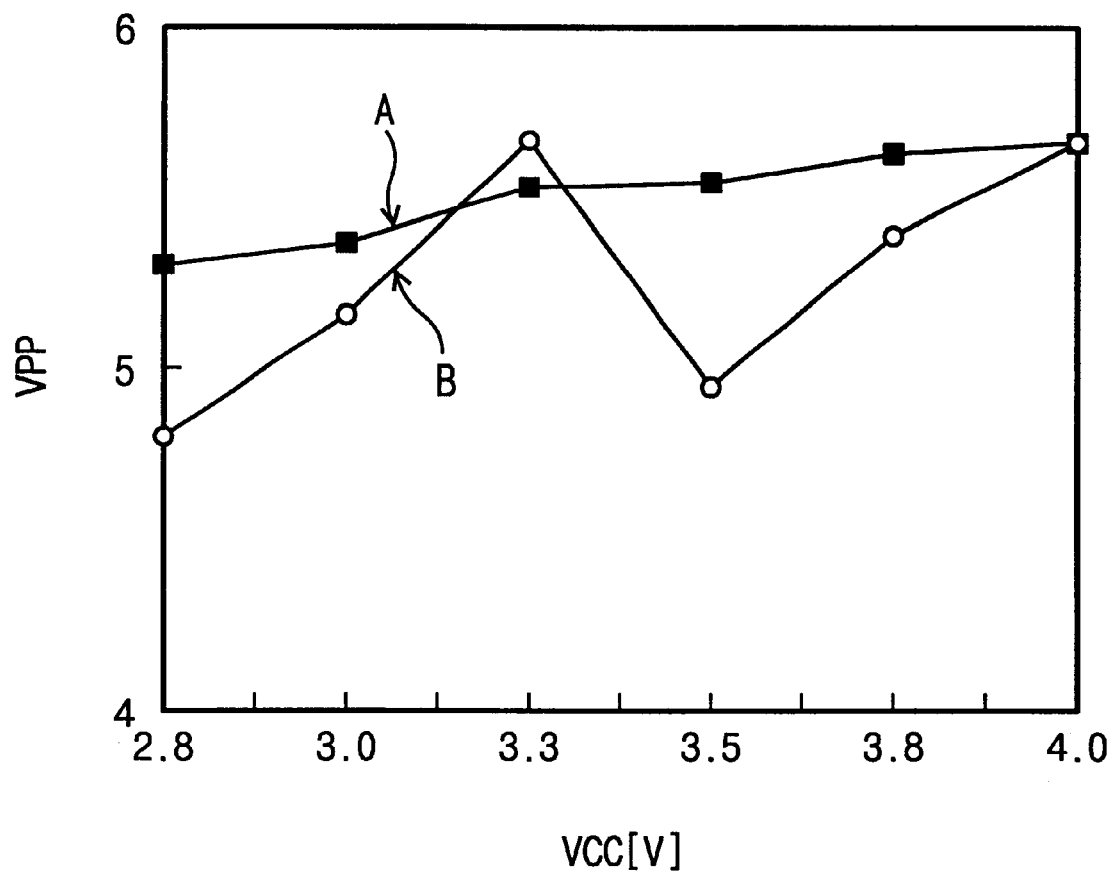
FIG. 6 is a graph showing how the boosted voltage of the circuit of FIG. 4 fluctuates if there is a variation in the power supply voltage.

FIG. 6 is a graph comparing the performance of an embodiment of the invention (line A) with that of the prior art (line B, repeated from FIG. 2). It will be observed that line A is much smoother than line B, as a result of the voltage clamp circuit 120 of FIG. 3. Indeed, line A varies from 5.3V to 5.67V, while line B varies between 4.80V and 5.67V.

Figure 1:
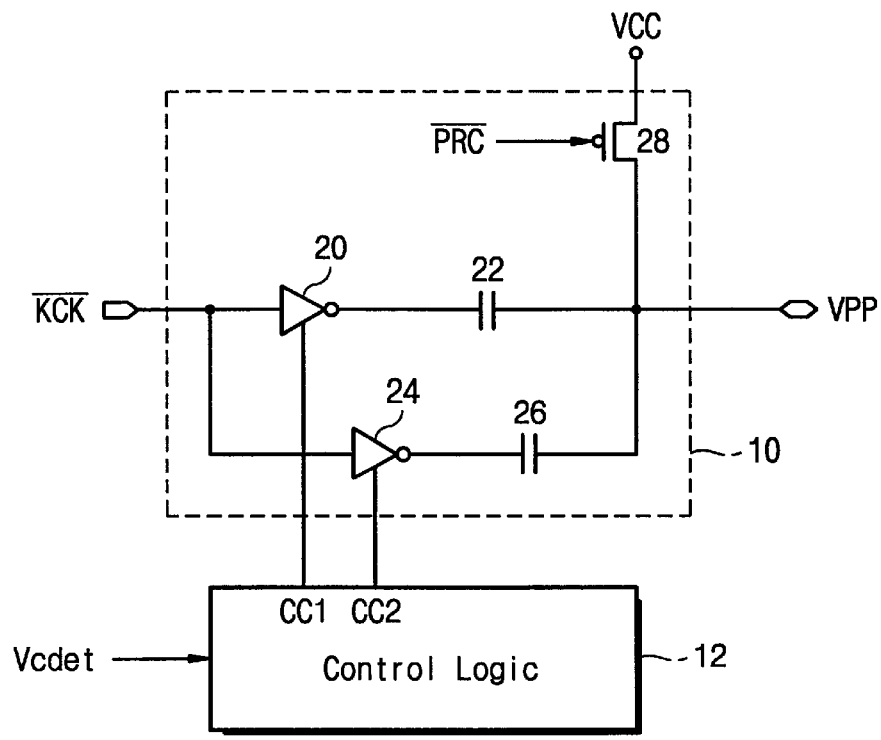
FIG. 1 is a circuit diagram showing a voltage boosting circuit in the prior art.

For FIG. 6, the power supply voltage VCC assumes the values of 2.8V, 3V, 3.3V, 3.8V, and 4V. The two capacitors 412, 422 used in the booster 110 of the voltage boosting circuit 100 shown in FIG. 4 occupy 6,498 $\mu m^2$, which is exactly the same topological size as the capacitors 22 and 26 used in the prior art booster 10 of FIG. 1 (2×3,249 $\mu m)^2$.

According to the present invention, detecting the boosted voltage from the booster and discharging the boosted voltage in accordance with the detected voltage can minimize the fluctuation of the boosted voltage affected by variation of the power supply voltage.

What is claimed is:

1. A voltage boosting circuit for an integrated circuit, comprising:
   a booster that generates a boosted voltage higher than a first supply voltage by using the first supply voltage and a second supply voltage lower than the first supply voltage, in response to a boosting control signal;
   a voltage detector that generates a detected voltage signal representing an attribute of the boosted voltage, in response to the boosting control signal;
   a pulse generator that generates a pulse signal responsive to a voltage level of the detected voltage signal; and
   a discharge circuit that provides a current path so as to discharge the boosted voltage during an activation period of the pulse signal.

2. The circuit of claim 1, wherein the voltage detector senses a level of the boosted voltage.

3. The circuit of claim 1, wherein the attribute is a deviation of the instantaneous boosted voltage from a desired preset voltage.

4. The circuit of claim 1, wherein the voltage detector includes:
   an inverter for inverting the boosting control signal;
   a switch transistor having a first terminal connected to receive the boosted voltage, a gate terminal connected to receive an output signal from the inverter and a third terminal; and
   a voltage divider connected between the third terminal of the switch transistor and the second supply voltage.

5. The circuit of claim 4, wherein the inverter is operated from the boosted voltage.

6. The circuit of claim 4, wherein the voltage divider includes:
   a plurality of diode-connected transistors connected in series between the boosted voltage and an output terminal of the voltage divider; and
   a resistor connected between the output terminal of the voltage divider and the second supply voltage.

7. The circuit of claim 6, wherein the diode-connected transistors are formed of enhancement-type MOS transistors.

8. The circuit of claim 1, wherein the pulse generator includes an inverter connected between the voltage detector and the discharge circuit.

9. The circuit of claim 1, wherein
   the pulse generator includes first and second inverters connected successively between the voltage detector and the discharge circuit in series, and
   the first inverter receives the first supply voltage through a resistor.

10. The circuit of claim 1, wherein the discharge circuit is formed of a NMOS transistor.

11. A voltage boosting circuit for an integrated circuit, comprising:
- a booster that generates a boosted voltage higher than a first supply voltage by using the first supply voltage and a second supply voltage lower than the first supply voltage, in response to a boosting control signal;
- a voltage detector that generates a detected voltage signal representing an attribute of the boosted voltage, in response to the boosting control signal, wherein the voltage detector comprises an inverter that inverts the boosting control signal, a switch transistor having a first terminal connected to receive the boosted voltage and having a gate terminal connected to receive an output signal from the inverter and a third terminal, and a voltage divider connected between the third terminal of the switch transistor and the second supply voltage;
- a pulse generator that generates a pulse signal responsive to a voltage level of the detected voltage signal; and
- a discharge circuit that provides a current path so as to discharge the boosted voltage during an activation period of the pulse signal.

12. The circuit of claim 11, wherein the inverter is operated from the boosted voltage.

13. The circuit of claim 11, wherein the voltage divider comprises:
- a plurality of diode-connected transistors connected in series between the boosted voltage and an output terminal of the voltage divider; and
- a resistor connected between the output terminal of the voltage divider and the second supply voltage.

14. The circuit of claim 13, wherein the diode-connected transistors are formed of enhancement-type MOS transistors.

15. A voltage boosting circuit for an integrated circuit, comprising:
- a booster that generates a boosted voltage higher than a first supply voltage by using the first supply voltage and a second supply voltage lower than the first supply voltage, in response to a boosting control signal;
- a voltage detector that generates a detected voltage signal representing an attribute of the boosted voltage, in response to the boosting control signal;
- a discharge circuit that provides a current path so as to discharge the boosted voltage during an activation period of a pulse signal; and
- a pulse generator that generates the pulse signal responsive to a voltage level of the detected voltage signal, wherein the pulse generator comprises first and second inverters connected successively between the voltage detector and the discharge circuit in series, and the first inverter receives the first supply voltage through a resistor.

* * * * *

UNITED STATES PATENT AND TRADEMARK OFFICE
CERTIFICATE OF CORRECTION

PATENT NO. : 6,590,442 B2
DATED : July 8, 2003
INVENTOR(S) : Sang-Kil Lee et al.

It is certified that error appears in the above-identified patent and that said Letters Patent is hereby corrected as shown below:

<u>Column 6,</u>
Line 3, "5.3V" should read -- 5.31V --.
Line 10, "(2x3,249 $\mu$m)$^2$" should read -- (2x3,249 $\mu$m$^2$) --.

Signed and Sealed this

Twentieth Day of January, 2004

JON W. DUDAS
*Acting Director of the United States Patent and Trademark Office*